United States Patent
Dupont et al.

(10) Patent No.: US 8,581,229 B2
(45) Date of Patent: Nov. 12, 2013

(54) III-V LIGHT EMITTING DEVICE WITH THIN N-TYPE REGION

(75) Inventors: Frederic Dupont, Seyssins (FR); John E. Epler, San Jose, CA (US)

(73) Assignees: Koninklijke Philips N.V., Einhoven (NL); Philips Lumileds Lighting Company, LLC, San Jose, CA (US)

( * ) Notice: Subject to any disclaimer, the term of this patent is extended or adjusted under 35 U.S.C. 154(b) by 402 days.

(21) Appl. No.: 12/624,268

(22) Filed: Nov. 23, 2009

(65) Prior Publication Data

US 2011/0121332 A1    May 26, 2011

(51) Int. Cl.
 *H01L 29/06* (2006.01)
 *H01L 31/00* (2006.01)

(52) U.S. Cl.
 USPC ............. 257/13; 257/94; 257/98; 257/14

(58) Field of Classification Search
 USPC ......... 257/13, 94, 14, 98, 96, 87, 101, 79, 11, 257/190, 103, 78, 22, 88, 9, 95, 613, 90
 See application file for complete search history.

(56) References Cited

U.S. PATENT DOCUMENTS

| | | | |
|---|---|---|---|
| 7,361,938 B2 | 4/2008 | Mueller et al. | |
| 7,939,839 B2 * | 5/2011 | Hasnain | 257/93 |
| 2004/0031967 A1 | 2/2004 | Fudeta et al. | |
| 2005/0173724 A1 | 8/2005 | Liu | |
| 2005/0224822 A1 * | 10/2005 | Liu | 257/84 |
| 2005/0269582 A1 * | 12/2005 | Mueller et al. | 257/94 |
| 2007/0072324 A1 | 3/2007 | Krames et al. | |
| 2007/0284588 A1 * | 12/2007 | Kinoshita | 257/79 |
| 2008/0048202 A1 * | 2/2008 | Tazima et al. | 257/98 |
| 2008/0153192 A1 | 6/2008 | Grillot et al. | |
| 2008/0303039 A1 * | 12/2008 | Craford et al. | 257/89 |
| 2009/0140272 A1 | 6/2009 | Beeson et al. | |
| 2009/0159920 A1 | 6/2009 | Kim et al. | |
| 2009/0302334 A1 * | 12/2009 | Yao et al. | 257/93 |
| 2010/0072489 A1 * | 3/2010 | McLaurin et al. | 257/88 |
| 2010/0320489 A1 * | 12/2010 | Epler | 257/98 |
| 2010/0327300 A1 * | 12/2010 | Epler et al. | 257/98 |

FOREIGN PATENT DOCUMENTS

WO     02056394 A1    7/2002

OTHER PUBLICATIONS

U.S. Appl. No. 12/236,853; Entitled: "Semiconductor Light Emitting Devices Grown on Composite Substrates" filed Sep. 24, 2008. Inventor(s) Melvin B. McLaurin; pp. 18.

* cited by examiner

*Primary Examiner* — Telly Green

(57) ABSTRACT

A device includes a semiconductor structure comprising a III-nitride light emitting layer disposed between an n-type region and a p-type region. A transparent, conductive non-III-nitride material is disposed in direct contact with the n-type region. A total thickness of semiconductor material between the light emitting layer and the transparent, conductive non-III-nitride material is less than one micron.

13 Claims, 3 Drawing Sheets

III-V LIGHT EMITTING DEVICE WITH THIN N-TYPE REGION

BACKGROUND

1. Field of Invention

The present invention relates to a III-V light emitting device with a transparent conductive oxide connected to the n-type region.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since native III-nitride growth substrates are generally expensive, not widely available, and impractical for growth of commercial devices, III-nitride devices are often grown on sapphire ($Al_2O_3$), SiC, or Si substrates. Such non-native substrates have different lattice constants than the bulk lattice constants of the III-nitride device layers grown on the substrate, different thermal expansion coefficients, and different chemical and structural properties than the device layers, resulting in strain in the device layers, and chemical and structural mismatch between the device layers and the substrates. Growth of thick layers can reduce the output of the device, and require extra source material, which can increase the cost of a device. If the device layers are grown overly thick, the strain may be relieved by cracking, which can negatively impact the device performance.

When a III-nitride device is conventionally grown on $Al_2O_3$, the first structure grown on the substrate is generally a GaN template layer with an in-plane a-lattice constant of about 3.189 Å or less. The GaN template serves as a lattice constant template for the light emitting region in that it sets the lattice constant for all of the strained layers grown above the template layer, including the InGaN light emitting layer. Since the bulk lattice constant of InGaN is larger than the in-plane lattice constant of the conventional GaN template, the light emitting layer is compressively strained when grown over a conventional GaN template. For example, a light emitting layer configured to emit light of about 450 nm may have a composition $In_{0.16}Ga_{0.84}N$, a composition with a bulk lattice constant of 3.242 Å, as compared to the lattice constant of GaN, 3.189 Å. As the InN composition in the light emitting layer increases, as in devices designed to emit light at longer wavelengths, the compressive strain in the light emitting layer also increases.

Several techniques for reducing the strain in the light emitting layer have been proposed.

US 2008/0153192, titled "III-nitride light emitting devices grown on templates to reduce strain" and incorporated herein by reference, teaches growing the device layers including the light emitting layer of a III-nitride device over a template designed to reduce strain in the device, in particular in the light emitting layer. The template is grown on a conventional substrate such as sapphire.

US 2007/0072324, titled "Substrate for growing a III-V light emitting device" and incorporated herein by reference, teaches growing a III-nitride device over a composite substrate, which includes a host substrate, a seed layer, and a bonding layer that bonds the host to the seed layer. The host substrate provides mechanical support to the composite substrate and to the semiconductor device layers grown over the composite substrate. The seed layer is generally a single crystal material that is a reasonably close lattice-match to the device layers. With such a substrate, it is possible to increase the lattice constant beyond GaN, in which case the device layers grown on these templates generally contain In. Incorporation of In is not energetically favorable and growth of InGaN is slow. Thick InGaN layers are therefore not commercially feasible.

Needed in the art are devices that do not require thick n-type regions.

SUMMARY

It is an object of the invention to provide a device with a thin n-type region.

In embodiments of the invention, a device includes a semiconductor structure comprising a III-nitride light emitting layer disposed between an n-type region and a p-type region. A transparent, conductive non-III-nitride material is disposed in direct contact with the n-type region. A total thickness of semiconductor material between the light emitting layer and the transparent, conductive non-III-nitride material is less than one micron.

BRIEF DESCRIPTION OF THE DRAWINGS

FIG. 3 further illustrates removal of the growth substrate of the structure of FIG. 2

DETAILED DESCRIPTION

In a flip-chip device, conventionally grown on a sapphire substrate, a p-contact is formed on the surface of the last p-type layer grown in the device, then a mesa is etched to expose a portion of the n-type region on which an n-contact is formed. The p-contact typically covers a much larger area than the n-contact, since current spreads more readily through n-type III-nitride material. The n-contact is typically formed on an n-type GaN layer. The n-type GaN layer must be thick enough and conductive enough to provide a low sheet resistance, for example less than 20 Ω/square, in a conventional III-nitride flip-chip device.

As used herein, a given layer has a bulk lattice constant $a_{bulk}$ corresponding to a lattice constant of free standing material of the same composition as that layer, and an in-plane lattice constant $a_{in-plane}$ corresponding to a lattice constant of that layer as grown in an actual device structure. In a device where the device layers are grown over a template that increases the in-plane lattice constant in the light emitting region to reduce the strain in the light emitting region, referred to herein as a "reduced strain" device for economy of language, the in-plane lattice constant set by the template is generally larger than the bulk lattice constant of GaN. As a result, GaN grown over such templates is in tension. The thickness of any GaN layers incorporated in a reduced strain device must be limited, to avoid cracking which may reduce the efficiency of the device or cause device failure. In some embodiments, an n-type GaN layer thick enough to provide sufficient current spreading to serve as the n-type layer on which the n-contact is formed cannot be grown without cracking in a reduced strain device.

InGaN, which has a larger bulk lattice constant than GaN, can be grown over a reduced strain template in compression, or under less tension than GaN, and is thus often used as the n-type contact layer of a reduced strain device, instead of GaN. Growing an InGaN layer thick enough to serve as the n-contact layer in a device design that requires current to spread from the n-contact is prohibitively time-consuming and therefore expensive. Such a current spreading InGaN layer may be, for example, at least 2 microns thick.

In some embodiments of the invention, the contacts on a reduced strain III-nitride device are formed and arranged such that current spreading in a thick n-type region is not required. The n-type region may therefore be made thinner than in a device where current spreads through the n-type region.

FIGS. 1-5 illustrate forming a vertical device with a thin n-type region.

Figure 1:
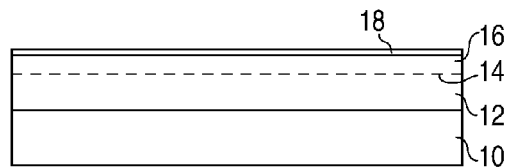
FIG. 1 illustrates device layers grown over a substrate.

In FIG. 1, device layers including an n-type region 12, a light emitting region 14, and a p-type region 16 are grown over a substrate 10. The substrate may be, for example, one of the templates grown over a growth substrate such as sapphire as described in US 2008/0153192, a composite substrate as described in US 2007/0072324, such as, for example, an InGaN seed layer bonded to a sapphire host, or a sapphire, SiC, or Si substrate.

The n-type region 12 may include multiple layers of different compositions and dopant concentration including, for example, preparation layers such as buffer layers or nucleation layers, which may be n-type or not intentionally doped, release layers designed to facilitate later release of the composite substrate or thinning of the semiconductor structure after substrate removal, and n- or even p-type device layers designed for particular optical or electrical properties desirable for the light emitting region to efficiently emit light. In some embodiments, the n-type region is less than one micron thick. In some embodiments, the n-type region is less than 0.5 microns thick. In some embodiments, the n-type region includes at least one InGaN layer. In some embodiments, the n-type region includes only InGaN. In some embodiments, the n-type region has an in-plane lattice constant larger than the in-plane lattice constant of GaN grown on sapphire, or the n-type region has an in-plane lattice constant larger than 3.186 Å.

A light emitting or active region 14 is grown over the n-type region 12. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 16 is grown over the light emitting region 14. Like the n-type region, the p-type region may include multiple layers of different composition, thickness, and dopant concentration, including layers that are not intentionally doped, or n-type layers.

A p-contact 18 is formed on the top surface of p-type region 16. P-contact 18 may include a reflective layer, such as silver. P-contact 18 may include other optional layers, such as an ohmic contact layer and a guard sheet including, for example, titanium and/or tungsten. In some embodiments, p-contact 18 is removed from areas that are aligned with later-formed n-contacts, to prevent light from being generated in the light emitting region directly between the p- and n-contacts, since light generated between the contacts is likely to be absorbed. A current blocking structure such as a resistive material (not shown in FIG. 1), may be formed in these areas.

Figure 2:
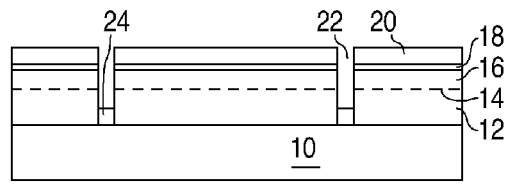
FIG. 2 illustrates trenches formed in the structure of FIG. 1.

In FIG. 2, trenches 22 are formed in the device. The trenches extend through the entire thickness of the III-nitride material, down to a non-III-nitride layer of substrate 10. After trenches 22 are formed, an optional bonding layer 20 is disposed on the surface of p-contact 18. Bonding layer 24 may also be disposed in trenches 22. Bonding layer 20 and 24 may be, for example, a metal such as NiAu. Trenches 22 may be, for example, between 10-30 μm wide. In some embodiments, trenches 22 form the boundaries of individual LEDs on a wafer of LEDs and are spaced in accordance with the desired die size, for example between 0.2 and 2 mm apart, often between 0.5 and 1 mm apart. Trenches 22 may limit damage caused by laser melting to remove all or part of substrate 10, as described below in reference to FIG. 3.

Figure 3:
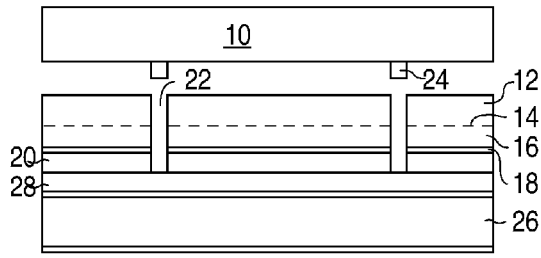
FIG. 3 illustrates the structure of FIG. 2 bonded to a mount.

In FIG. 3, the device is bonded to a mount 26. An optional bonding layer 28 may be formed on mount 26. The semiconductor structure may be bonded to mount 26 via one or more bonding layers 20 and 28. Mount 26 may be, for example, Si, Ge, metal, or ceramic. Bonding layer 28 may be, for example, a metal such as NiAu.

After the semiconductor structure is bonded to mount 26, growth substrate 10 may be removed. For example, a sapphire growth substrate or a sapphire host substrate that is part of a composite substrate may be removed by laser melting of a III-nitride or other layer at an interface with the sapphire substrate. Other techniques, such as etching or mechanical techniques such as grinding may be used as appropriate to the substrate being removed. Parts of the substrate, such as, for example, the seed layer of a composite substrate or one or more semiconductor layers of a lattice-constant expanding template grown on a non-III-nitride growth substrate, may remain a part of the device, though they may also be removed. If the bonding layer 24 in trenches 22 is not removed by the same process that removes the substrate, residual bonding layer material such as NiAu may be removed by, for example, wet etching.

In some embodiments, after removing all or part of substrate 10, the semiconductor structure is thinned, for example by photoelectrochemical (PEC) etching. The exposed surface of the semiconductor structure, often a surface of n-type region 12, may be textured, for example by roughening or by forming a photonic crystal.

Figure 4:
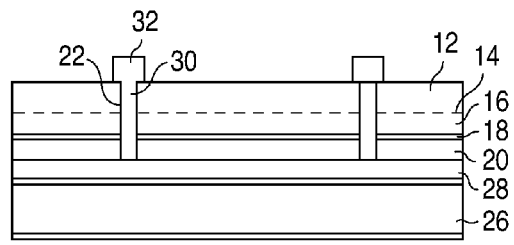
FIG. 4 illustrates the trenches of the structure of FIG. 3 filled with a dielectric.

In FIG. 4, trenches 22 are partially or completely filled with a dielectric material, such as, for example, a nitride of silicon formed by plasma-enhanced chemical vapor deposition. A dielectric layer may also be formed over the surface of n-type region 12 exposed by removing substrate 10, then patterned such that the dielectric remains only in regions 32 overlying trenches 22.

Figure 5:
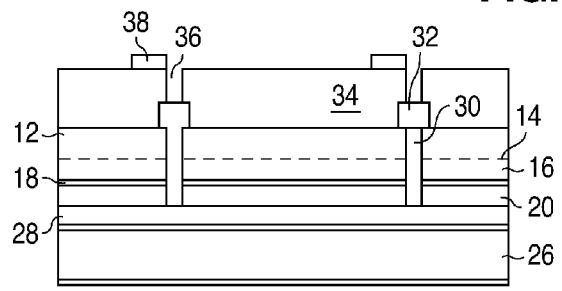
FIG. 5 illustrates a transparent conductive material and n-contacts formed on the structure of FIG. 4.

In FIG. 5, a transparent, conductive material 34 is disposed on the exposed surface of n-type region 12. In some embodiments, transparent conductive material 34 is an oxide such as indium tin oxide (ITO). Transparent conductive material 34 may be deposited by, for example, electron beam evaporation, sputtering, spinning on, or sedimentation. The thickness of transparent conductive material 34 may be, for example, 0.5 to 1.5 µm, depending upon the thickness and doping of the n-type device layer, and the stoichiometry of the transparent conductive material. For example, a thicker transparent conductive material layer may be formed on an n-type region that is thin or not highly doped, or if the transparent conductive material is not highly conductive. Alternatives to ITO include aluminum-doped ZnO (AZO), ZnO, magnesium-doped ZnO (MZO), gallium-doped ZnO (GZO), aluminum-doped MZO (AMZO), ZnO-doped indium oxide (ZIO), and gallium-doped MZO (GMZO). Transparent, conductive material 34 is formed thick enough to spread current in n-type region 12, but thin enough that it does not substantially absorb light emitted by the light emitting region. Trenches 36, which align with oxide regions 32, are formed in transparent conductive material 34 by conventional patterning steps. Metal n-contacts 38 are formed on transparent, conductive material 34. Trenches 36 and 22 electrically isolate adjacent regions of semiconductor material and transparent conductive material 34, which permits testing of individual regions before a wafer of individual regions is diced.

In embodiments where the growth substrate is removed by etching, such as in the case of a silicon growth substrate, trenches 22 may be formed in the epitaxial layers after the growth substrate is removed, rather than before, as illustrated in FIGS. 2 and 3. In these embodiments, trenches 22 may be formed after transparent conductive material 34 is formed.

Light is extracted from the structure illustrated in FIG. 5 through transparent conductive material 34. Mount 26 and any bonding layers between mount 26 and p-contact 18 may be conductive, such that current is supplied to p-contact 18 through mount 26. A total thickness of the semiconductor material between light emitting region 14 and transparent conductive material 34 may be no more than 1 micron thick in some embodiments, no more than 0.8 microns thick in some embodiments, and no more than 0.5 microns thick in some embodiments. In some embodiments, the entire semiconductor structure between the transparent conductive material 34 and p-contact 18 is InGaN.

For a given III-nitride material, the sheet resistance, expressed in $\Omega$/square, is a function of the thickness and doping. The sheet resistance of the n-type region 12 may be greater than 90 $\Omega$/square in some embodiments and greater than 80 $\Omega$/square in some embodiments. The combination of the n-type region 12 and the transparent, conductive material 24 may have a sheet resistance of less than 70 $\Omega$/square in some embodiments and less than 60 $\Omega$/square in some embodiments. In contrast, in a conventional III-nitride device with a thick, GaN n-type region, the sheet resistance of the n-type region is about 40 $\Omega$/square.

FIGS. 6-12 illustrate forming a device with a thin n-type region bonded to an optical element such as a luminescent ceramic. Materials and processing steps described in FIGS. 6-12 may be the same as described above in FIGS. 1-5, and vice versa.

Figure 6:
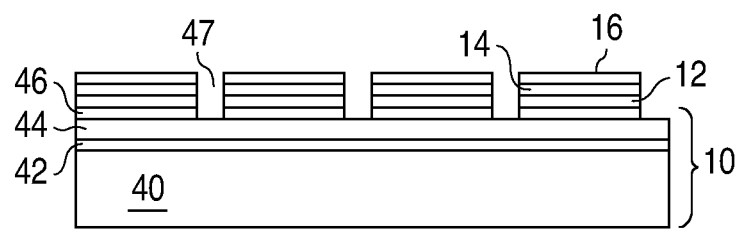
FIG. 6 illustrates device layers grown on a composite substrate with a seed layer formed in regions with trenches separating the regions.

FIG. 6 illustrates an n-type region 12, light emitting region 14, and p-type region 16 grown over a composite substrate 10. The composite substrate 10 includes a host substrate 40, such as, for example, sapphire; bonding layers 42 and 44, such as, for example, a nitride of silicon and an oxide of silicon, respectively; and a seed layer 46, such as, for example, InGaN with an InN composition of not more than 8%. The seed layer may be formed in regions or islands as described in, for example, U.S. application Ser. No. 12/236,853, which is incorporated herein by reference. The seed layer may be, for example, between 500 Å and 2000 Å thick in some embodiments and about 1000 Å thick in some embodiments. The device layers 12, 14, and 16 are grown under conditions that favor vertical over horizontal growth, such that the trenches 47 between semiconductor regions are maintained. In some embodiments, n-type region 12 is an InGaN region between 0.2 and 0.5 microns thick, light emitting region 14 is a multi-quantum-well active region about 1000 Å thick, and p-type region 16 is a layer of InGaN about 1000 Å thick.

Figure 7:
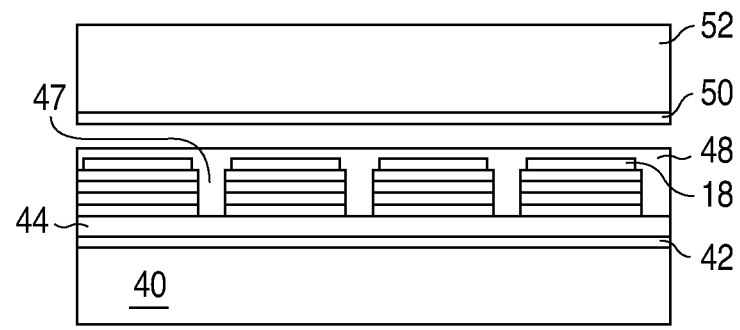
FIG. 7 illustrates the structure of FIG. 6 bonded to an intermediate substrate.

In FIG. 7, a p-contact 18 is formed over the p-type region 16, then patterned to remove the p-contact material disposed on the sidewalls of the regions of semiconductor material. Some p-contact material may remain in the bottom of trenches 47 between regions of semiconductor material. In some embodiments, poor quality semiconductor material on the sidewalls of the regions is removed at the same time. A bonding material 48 such as an oxide of silicon is disposed over the p-contact 18 and in the trenches 47 between regions of semiconductor material. The bonding material 48 may be optionally polished by, for example, chemical mechanical polishing. The semiconductor structure is bonded to an intermediate substrate 52 which may be, for example, sapphire, or any other suitable substrate with a coefficient of thermal expansion that is a reasonably close match to host 40. An optional bonding layer 50, which may be, for example, an oxide of silicon, may be formed on intermediate substrate 52.

Figure 8:
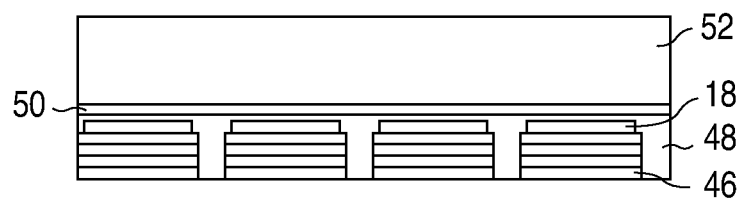
FIG. 8 illustrates the structure of FIG. 7 after the host substrate of the composite growth substrate is removed.

In FIG. 8, the host substrate 40 and bonding layers 42 and 44 of FIG. 6 are removed by a technique suitable for removing the particular host substrate material. For example, a sapphire host may be removed by laser melting.

Figure 9:
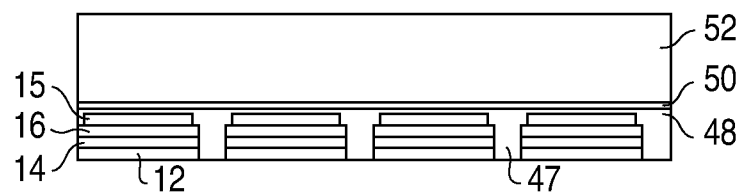
FIG. 9 illustrated the structure of FIG. 8 after the seed layer is removed.

The seed layer 46 is removed in FIG. 9, by a technique suitable for removing the particular seed layer material. For example, an InGaN or other III-nitride seed layer may be removed by PEC etching or chemical mechanical polishing (CMP). The semiconductor structure may optionally be thinned, and the exposed surface may optionally be textured. Any p-contact material in the trenches 47 between islands of semiconductor material may also be removed.

Figure 10:
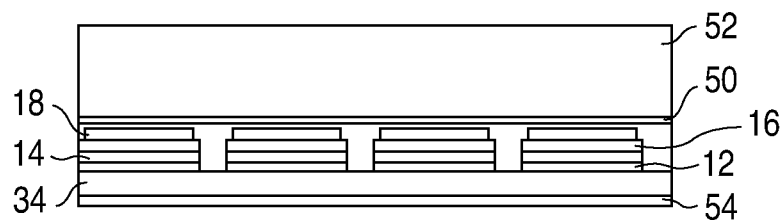
FIG. 10 illustrates the structure of FIG. 9 after forming a transparent, conductive layer on the exposed semiconductor surface.

In FIG. 10, a transparent, conductive material 34 is formed on the exposed n-type region 12. The transparent conductive material 34 may be, for example, a transparent conductive oxide such as ITO. An optional bonding layer 54 such as, for example, an oxide of silicon may be formed on transparent, conductive material 34, then optionally polished by, for example, chemical mechanical polishing.

Figure 11:
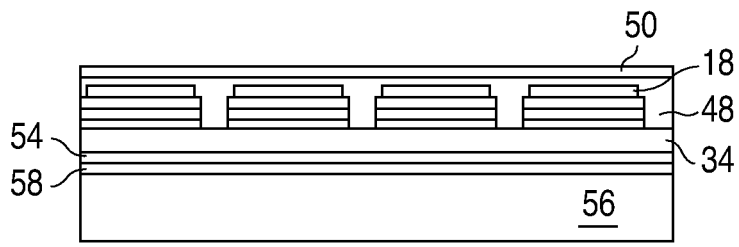
FIG. 11 illustrates the structure of FIG. 10 after bonding to a optical element and removing the intermediate substrate.

In FIG. 11 the transparent, conductive material 34 is bonded to an optical element 56. An optional bonding layer 58 may be formed on optical element 56. The optical element may be, for example, a lens or a luminescent ceramic, also referred to as a ceramic phosphor. Luminescent ceramics may be phosphors formed into a ceramic. The luminescent ceramic absorbs light of a wavelength emitted by the light emitting region and emits light of a different wavelength. Luminescent ceramics are described in more detail in U.S. Pat. No. 7,361,938, which is incorporated herein by reference. After bonding to the optical element 56, intermediate substrate 52 may be removed by a technique suitable to the substrate material. For example, a sapphire intermediate substrate may be removed by laser lift off.

Bonding layers 48, 50, 54, and 58, shown in FIGS. 7, 10, and 11 may be, for example, an organic material such as silicone or an inorganic material such as silicon oxide. All of the bonding layers need not be the same material. In some embodiments, both bonding layers that form a bond are oxides of silicon. Oxide-oxide bonding may be employed to join either planar or nonplanar surfaces. To form an oxide-oxide bond, pressure is applied between the two structures. Heat may also be applied. In some embodiments, bonding layers 48, 50, 54, and 58 may be oxides, nitrides, carbides, or fluorides of Si, Al, B, P, Zn, Ga, Ge, In, Sn, Sb, Pb, Bi, Ti, W, Mg, Ca, K, Ni, Y, Zr, Hf, Nd, and Ta, or commercially available suitable glasses from, for example, Hoya, Ohara, Schott, CDGM, Hikari, Sumita, and Corning.

Figure 12:
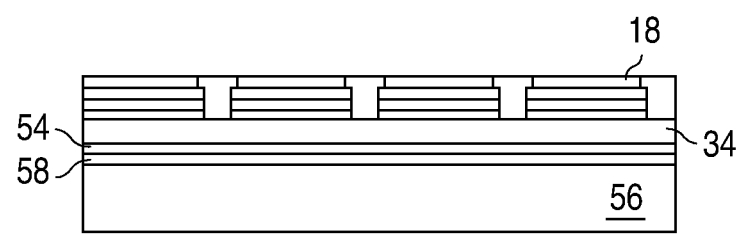
FIG. 12 illustrates the structure of FIG. 11 after removing any remaining bonding layers to expose a surface of the p-contact.

In FIG. 12 any remaining bonding layers, such as bonding layer 50 and bonding layer 48, may be removed, to expose a top surface of the p-contact.

Figure 13:
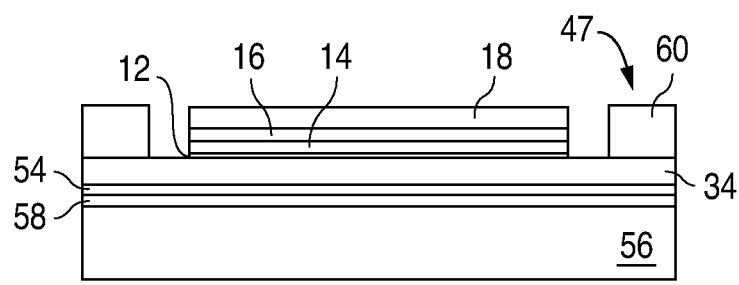
FIG. 13 illustrates a region of FIG. 12, with contacts formed in a flip chip formation.

FIG. 13 illustrates one of the regions of FIG. 12. The contacts are arranged in a flip-chip orientation. In the device of FIG. 13, when the p-contact material is removed from the sidewalls of the regions, as described above in reference to FIG. 7, in the same etching step the trenches 47 between regions are widened to accommodate n-contacts 60. N-contacts are formed in trenches 47 in electrical contact with transparent, conductive material 34. Current spreads from n-contact 60 through transparent, conductive material 34 to n-type region 12.

In the device illustrated in FIG. 13, light is extracted from the device through optical element 56. A single LED may include a single region or multiple regions.

The LED illustrated in FIG. 13 is bonded to mount. Interconnects are formed on p-contact 18 and n-contacts 60, then the device is connected to a mount through the interconnects. The interconnects may be any suitable material, such as solder or other metals, and may include multiple layers of materials. In some embodiments, interconnects include at least one gold layer and the bond between the LED and the mount is formed by ultrasonic bonding.

During ultrasonic bonding, the LED die is positioned on a mount. A bond head is positioned on the top surface of the LED die, for example on the top surface of the optical element 56. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of a structure on the LED, such as the n- and p-contacts or interconnects formed on the n- and p-contacts, to interdiffuse with a structure on the mount, resulting in a metallurgically continuous joint. Heat and/or pressure may be added during bonding.

One or more wavelength converting materials may be disposed over transparent conductive layer 34 of FIG. 5 or over the optical element 56 of FIG. 13. The wavelength converting material(s) may be, for example, one or more powder phosphors disposed in a transparent material such as silicone or epoxy and deposited on the LED by screen printing or stenciling, one or more powder phosphors formed by electrophoretic deposition, or one or more ceramic phosphors glued or bonded to the LED, one or more dyes, or any combination of the above-described wavelength converting layers. The wavelength converting materials may be formed such that a portion of light emitted by the light emitting region is unconverted by the wavelength converting material. In some examples, the unconverted light is blue and the converted light is yellow, green, and/or red, such that the combination of unconverted and converted light emitted from the device appears white.

In some embodiments, polarizers, dichroic filters or other optics known in the art are formed over the transparent conductive layer 34 of FIG. 5 or over the optical element 56 of FIG. 13.

In the devices illustrated above, a thick n-type region, for example, with a thickness of at least two microns, is not required, since current is spread through a non-III-nitride transparent conductive material such as a transparent conductive oxide. Since transparent conductive oxides are generally not as transparent as III-nitride materials, in a device where the transparent, conductive non-III-nitride material is not needed for current spreading, such as in a device with a thick n-type region, including the transparent conductive non-III-nitride material may reduce the light output of the device.

Having described the invention in detail, those skilled in the art will appreciate that, given the present disclosure, modifications may be made to the invention without departing from the spirit of the inventive concept described herein. For example, though the above embodiments describe III-nitride devices, in embodiments of the invention, devices made from other materials systems may be used, such as other III-V device such as III-phosphide or III-arsenide devices, or II-VI devices. Therefore, it is not intended that the scope of the invention be limited to the specific embodiments illustrated and described.

What is being claimed is:

1. A device comprising:
   a semiconductor structure comprising a III-V light emitting layer disposed between an n-type region and a p-type region;
   a transparent, conductive non-III-nitride material in direct contact with the n-type region; and
   a reflective p-contact in direct contact with the p-type region on a surface of the semiconductor structure opposite the transparent, conductive non-III-nitride material;
   wherein a total thickness of semiconductor material between the light emitting layer and the transparent, conductive non-III-nitride material is no more than 0.8 micron.

2. The device of claim 1 wherein the transparent, conductive non-III-nitride material is an oxide.

3. The device of claim 1 where a total thickness of semiconductor material between the light emitting layer and the transparent, conductive non-III-nitride material is InGaN.

4. The device of claim 1 wherein an in-plane lattice constant of the semiconductor material between the light emitting layer and the transparent-conductive non-III-nitride material is greater than 3.186 Å.

5. The device of claim 1 wherein a majority of light extracted from the semiconductor structure is extracted through the transparent, conductive non-III-nitride material.

6. The device of claim 5 wherein at least one opening which exposes a surface of the transparent, conductive non-III-nitride material is formed in the semiconductor structure, the device further comprising a metal n-contact disposed in the opening on the transparent, conductive non-III-nitride material.

7. The device of claim 1 further comprising an optical element bonded to the transparent, conductive non-III-nitride material.

8. The device of claim 1 further comprising a luminescent ceramic bonded to the transparent, conductive non-III-nitride material.

9. The device of claim 1 further comprising trenches formed in the semiconductor material aligned with trenches formed in the transparent, conductive non-III-nitride material.

10. The device of claim 1 wherein the light emitting layer is a III-nitride material.

11. The device of claim 1 wherein the n-type region has a sheet resistance greater than 90 Ω/square and a combination of the n-type region and the transparent, conductive non-III-nitride material has a sheet resistance less than 70 Ω/square.

12. The device of claim 1 wherein the n-type region has a sheet resistance greater than 80 Ω/square and a combination of the n-type region and the transparent, conductive non-III-nitride material has a sheet resistance less than 60 Ω/square.

13. The device of claim 1 wherein the total thickness of semiconductor material between the light emitting layer and the transparent, conductive non-III-nitride material is no more than 0.5 micron.

* * * * *